United States Patent
Sasaki et al.

(10) Patent No.: US 8,488,401 B2
(45) Date of Patent: Jul. 16, 2013

(54) SEMICONDUCTOR STORAGE DEVICE

(75) Inventors: Shinichi Sasaki, Tokyo (JP); Atsushi Kawasumi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/237,562

(22) Filed: Sep. 20, 2011

(65) Prior Publication Data

US 2012/0243356 A1  Sep. 27, 2012

(30) Foreign Application Priority Data

Mar. 24, 2011  (JP) .................................. 2011-065370

(51) Int. Cl.
*G11C 7/06* (2006.01)

(52) U.S. Cl.
USPC .......................................... 365/203; 365/205

(58) Field of Classification Search
USPC ................................................. 365/203, 205
See application file for complete search history.

(56) References Cited

U.S. PATENT DOCUMENTS

| | | | |
|---|---|---|---|
| 5,966,332 A | 10/1999 | Takano | |
| 6,999,854 B2 * | 2/2006 | Roth | ............................. 700/282 |
| 2003/0117878 A1 | 6/2003 | Yamada | |
| 2004/0027852 A1 * | 2/2004 | Watanabe et al. | ............. 365/154 |
| 2002/0368392 | 6/2004 | Kang Sung-Mo et al. | |
| 2006/0268656 A1 | 11/2006 | Yokoyama | |
| 2010/0315882 A1 * | 12/2010 | Rho | ......................... 365/185.25 |

FOREIGN PATENT DOCUMENTS

| | | |
|---|---|---|
| JP | H9-213086 | 8/1997 |
| JP | 2003-007066 | 1/2003 |
| JP | 2003-030991 | 1/2003 |
| JP | 2003-196985 | 7/2003 |
| JP | 2006-331568 | 12/2006 |
| JP | 2009-151932 | 7/2009 |

OTHER PUBLICATIONS

U.S. Appl. No. 09/595,118, Apr. 2, 2002, Kawasumi.
Abu-Rahma, M.H. et al. "A Robust Single Supply Voltage SRAM Read Assist Technique Using Selective Precharge" ESSCIRC, pp. 234-237, 2008.

* cited by examiner

*Primary Examiner* — Michael Tran
(74) *Attorney, Agent, or Firm* — Knobbe Martens Olson & Bear LLP

(57) ABSTRACT

According to one embodiment, a memory cell stores therein data. In a bit line, a potential changes according to write data to be written in the memory cell. A precharge circuit precharges the bit line. A precharge control circuit controls precharge of the bit line based on the potential of the bit line and the write data.

19 Claims, 5 Drawing Sheets

| Pcg | we | cs | blt | Dw | Pcl |
|-----|----|----|-----|----|----|
| 1 | * | * | * | * | 1 |
| 0 | 0 | * | * | * | 0 |
| 0 | 1 | 0 | * | * | 0 |
| 0 | 1 | 1 | 0 | 0 | 1 |
| 0 | 1 | 1 | 0 | 1 | 0 |
| 0 | 1 | 1 | 1 | 0 | 0 |
| 0 | 1 | 1 | 1 | 1 | 1 |

SEMICONDUCTOR STORAGE DEVICE

CROSS-REFERENCE TO RELATED APPLICATIONS

This application is based upon and claims the benefit of priority from the prior Japanese Patent Application No. 2011-65370, filed on Mar. 24, 2011; the entire contents of which are incorporated herein by reference.

FIELD

Embodiments described herein relate generally to a semiconductor storage device.

BACKGROUND

In an SRAM (Static Random Access Memory), there is a method of precharging a bit line to a high level before writing data in a memory cell. This precharge causes increase in power consumption due to flowing of a charging current in a bit line.

DETAILED DESCRIPTION

In general, according to a semiconductor storage device of an embodiment, a memory cell, a bit line, a precharge circuit, and a precharge control circuit are provided. The memory cell stores therein data. In the bit line, a potential changes according to write data to be written in the memory cell. The precharge circuit precharges the bit line. The precharge control circuit controls precharge of the bit line based on the potential of the bit line and the write data.

A semiconductor storage device according to the embodiment will be explained below with reference to the drawings. The present invention is not limited to the embodiment.

Figure 1:
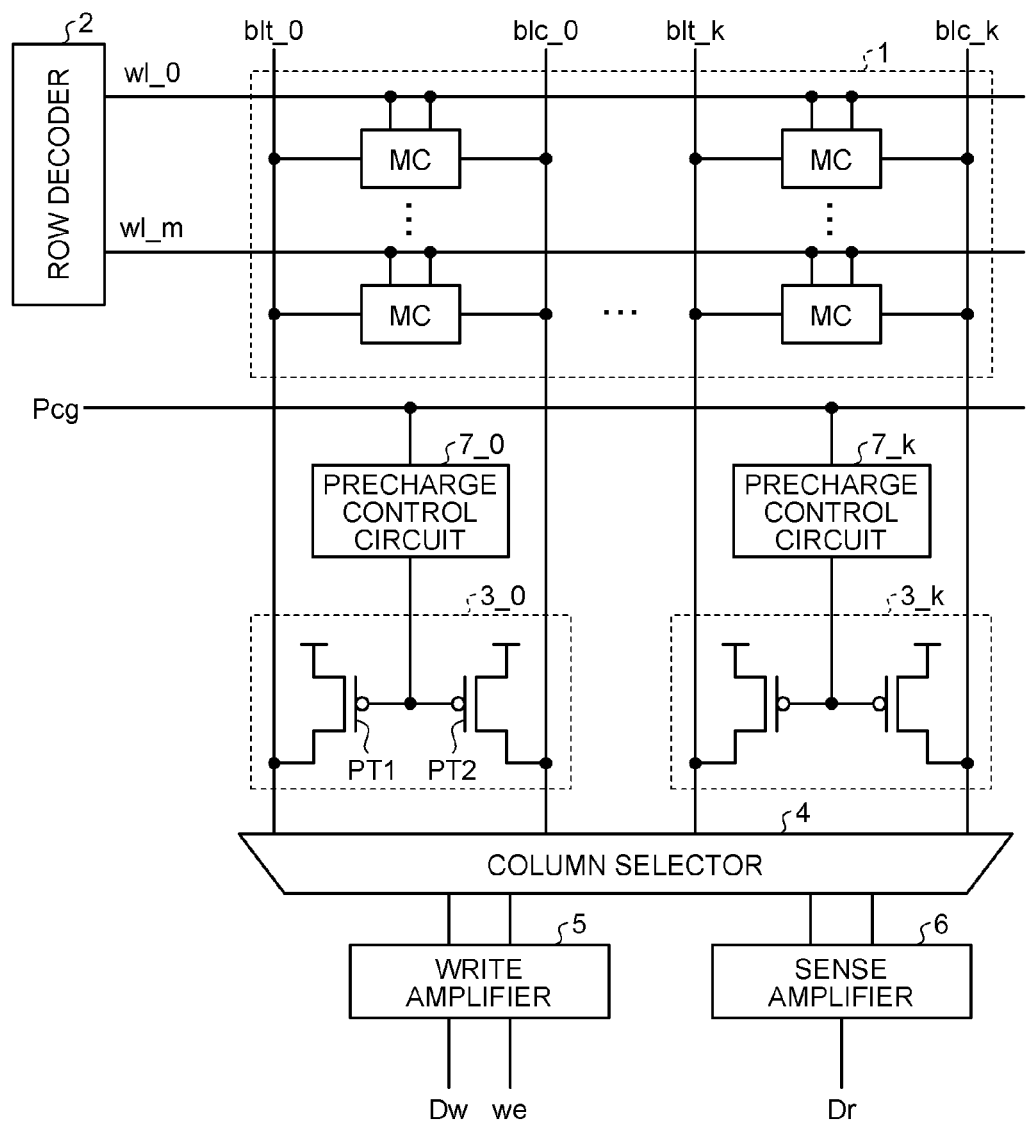
FIG. 1 is a block diagram illustrating a schematic configuration of a semiconductor storage device according to a present embodiment.

FIG. 1 is a block diagram illustrating a schematic configuration of a semiconductor storage device according to the present embodiment.

In FIG. 1, this semiconductor storage device includes a memory cell array 1, a row decoder 2, precharge circuits 3_0 to 3_k, a column selector 4, a write amplifier 5, a sense amplifier 6, and precharge control circuits 7_0 to 7_k.

In the memory cell array 1, memory cells MC are arranged in a matrix manner in a row direction and a column direction. The memory cell MC can complementarily store therein data in a pair of storage nodes, and for example, an SRAM cell can be used for the memory cell MC. Moreover, in the memory cell array 1, word lines wl_0 to wl_m (m is a positive integer) that perform row selection of the memory cells MC are provided and bit lines blt_0 to blt_k and blc_0 to blc_k (k is a positive integer) whose potential changes according to write data Dw and read data Dr are provided for respective columns.

The row decoder 2 can select any one of the word lines wl_0 to wl_m that is caused to perform row selection of the memory cells MC based on a row address and drive the selected any one of the word lines wl_0 to wl_m. The precharge circuits 3_0 to 3_k are provided for respective columns and can precharge the bit lines at the time of reading and writing.

The column selector 4 can perform column selection of the memory cells MC. The write amplifier 5 can drive the bit lines blt_0 to blt_k and blc_0 to blc_k for each column according to the write data Dw at the time of writing. The write amplifier 5 can complementarily drive the bit lines blt_0 to blt_k and the bit lines blc_0 to blc_k with each other. The sense amplifier 6 can detect data stored in the memory cells MC based on signals read out from the memory cells MC on the bit lines blt_0 to blt_k and blc_0 to blc_k.

The precharge control circuits 7_0 to 7_k are provided for the precharge circuits 3_0 to 3_k, respectively, and can each control precharge of a corresponding one of the bit lines blt_0 to blt_k of the own column based on the potential of the corresponding one of the bit lines blt_0 to blt_k of the own column and the write data Dw.

Figure 2:
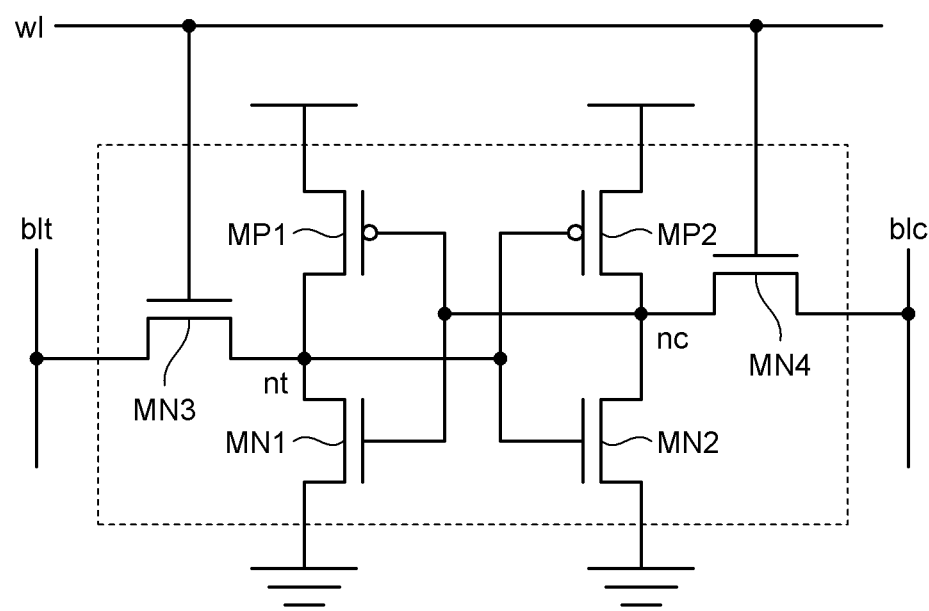
FIG. 2 is a diagram illustrating a circuit configuration of a memory cell shown in FIG. 1.

FIG. 2 is a diagram illustrating the circuit configuration of the memory cell shown in FIG. 1.

In FIG. 2, the memory cell MC includes P-channel field-effect transistors MP1 and MP2 and N-channel field-effect transistors MN1 to MN4. The P-channel field-effect transistors MP1 and MP2 can constitute a load transistor of the SRAM, the N-channel field-effect transistors MN1 and MN2 can constitute a drive transistor of the SRAM, and the N-channel field-effect transistors MN3 and MN4 can constitute a transfer transistor of the SRAM.

The P-channel field-effect transistor MP1 and the N-channel field-effect transistor MN1 are connected in series with each other to form a CMOS inverter and the P-channel field-effect transistor MP2 and the N-channel field-effect transistor MN2 are connected in series with each other to form a CMOS inverter. The outputs and the inputs of a pair of the CMOS inverters are cross-coupled with each other to form a flip-flop.

The word line wl is connected to the gates of the N-channel field-effect transistors MN3 and MN4. The bit line blt is connected to the gate of the P-channel field-effect transistor MP2, the gate of the N-channel field-effect transistor MN2, the drain of the P-channel field-effect transistor MP1, and the drain of the N-channel field-effect transistor MN1 via the N-channel field-effect transistor MN3. The bit line blc is connected to the drain of the P-channel field-effect transistor MP2, the drain of the N-channel field-effect transistor MN2, the gate of the P-channel field-effect transistor MP1, and the gate of the N-channel field-effect transistor MN1 via the N-channel field-effect transistor MN4.

The connection point of the drain of the P-channel field-effect transistor MP1 and the drain of the N-channel field-effect transistor MN1 can form a storage node nt and the connection point of the drain of the P-channel field-effect transistor MP2 and the drain of the N-channel field-effect transistor MN2 can form a storage node nc.

Figure 3:
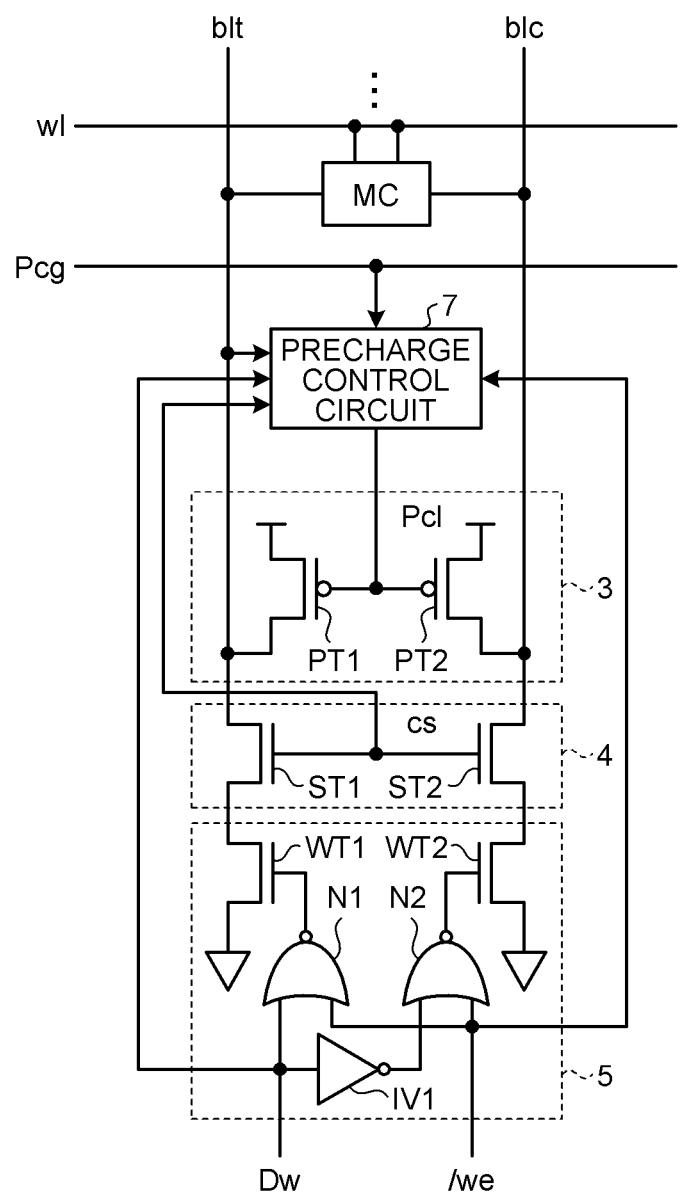
FIG. 3 is a block diagram illustrating a write amplifier portion for one column extracted from the semiconductor storage device in FIG. 1.

FIG. 3 is a block diagram illustrating a write amplifier portion for one column extracted from the semiconductor storage device in FIG. 1.

In FIG. 3, in the precharge control circuit 7, a global precharge signal Pcg, a column select signal cs, the write data Dw, a write enable inverted signal /we, and the potential of the bit line blt are input and a local precharge signal Pcl is output.

In the precharge circuit 3 for one column, precharge transistors PT1 and PT2 are provided. As the precharge transistors PT1 and PT2, P-channel field-effect transistors can be used.

The sources of the precharge transistors PT1 and PT2 are connected to the power supply potential and the drains of the precharge transistors PT1 and PT2 are connected to the bit lines blt and blc, respectively. The local precharge signal Pcl is input to the gates of the precharge transistors PT1 and PT2.

In the column selector 4 for one column, select transistors ST1 and ST2 are provided. As the select transistors ST1 and ST2, N-channel field-effect transistors can be used.

The select transistors ST1 and ST2 are inserted in series into the bit lines blt and blc, respectively. The column select signal cs is input to the gates of the select transistors ST1 and ST2.

In the write amplifier 5 for one column, write transistors WT1 and WT2, NOR circuits N1 and N2, and an inverter IV1 are provided. As the write transistors WT1 and WT2, N-channel field-effect transistors can be used.

The write transistors WT1 and WT2 are connected in series with the select transistors ST1 and ST2, respectively. The write data Dw is input to one input terminal of the NOR circuit N1 and the write data Dw is input to one input terminal of the NOR circuit N2 via the inverter IV1. The write enable inverted signal /we is input to the other input terminals of the NOR circuits N1 and N2. The output terminals of the NOR circuits N1 and N2 are connected to the gates of the write transistors WT1 and WT2, respectively.

Figures 4, 5:
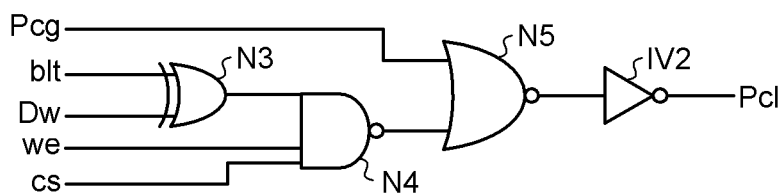
FIG. 4 is a block diagram illustrating a configuration of a precharge control circuit in FIG. 1.
FIG. 5 is a diagram illustrating a truth table of the precharge control circuit in FIG. 4.

FIG. 4 is a block diagram illustrating the configuration of the precharge control circuit in FIG. 1.

In FIG. 4, in the precharge control circuit for one column, an EXOR circuit N3, a NAND circuit N4, a NOR circuit N5, and an inverter IV2 are provided. The potential of the bit line blt is input to one input terminal of the EXOR circuit N3 and the write data Dw is input to the other input terminal of the EXOR circuit N3. The output of the EXOR circuit N3, the write enable signal we, and the column select signal cs are input to the NAND circuit N4. The global precharge signal Pcg is input to one input terminal of the NOR circuit N5 and the output terminal of the NAND circuit N4 is connected to the other input terminal of the NOR circuit N5. The output terminal of the NOR circuit N5 is connected to the input terminal of the inverter IV2.

FIG. 5 is a diagram illustrating a truth table of the precharge control circuit in FIG. 4. In this truth table, a logical value '0' corresponds to a low level (for example, ground potential) and a logical value '1' corresponds to a high level (for example, power-supply potential).

In FIG. 5, when the logical value of the global precharge signal Pcg is '1', the logical value of the local precharge signal Pcl becomes '1', so that precharge of the bit lines blt and blc is not performed.

When the logical values of the global precharge signal Pcg and the write enable signal we are '0', the logical value of the local precharge signal Pcl becomes '0', so that precharge of the bit lines blt and blc is performed. When the logical value of the write enable signal we is '0', a read operation is performed, so that precharge can be performed in the read operation.

When the logical values of the global precharge signal Pcg and the column select signal cs are '0' and the logical value of the write enable signal we is '1', the logical value of the local precharge signal Pcl becomes '0', so that precharge of the bit lines blt and blc is performed. When the logical value of the column select signal cs is '0', the column is a nonselected column, so that it is possible to cause the nonselected column to perform precharge at the time of the write operation.

When the logical value of the global precharge signal Pcg is '0' and the logical values of the write enable signal we and the column select signal cs are '1', if the potential of the bit line blt is equal to the write data Dw, the logical value of the local precharge signal Pcl becomes "1", so that precharge of the bit lines blt and blc is not performed.

On the other hand, when the logical value of the global precharge signal Pcg is '0' and the logical values of the write enable signal we and the column select signal cs are "1", if the potential of the bit line blt is different from the write data Dw, the logical value of the local precharge signal Pcl becomes '0', so that precharge of the bit lines blt and blc is performed.

Figure 6:
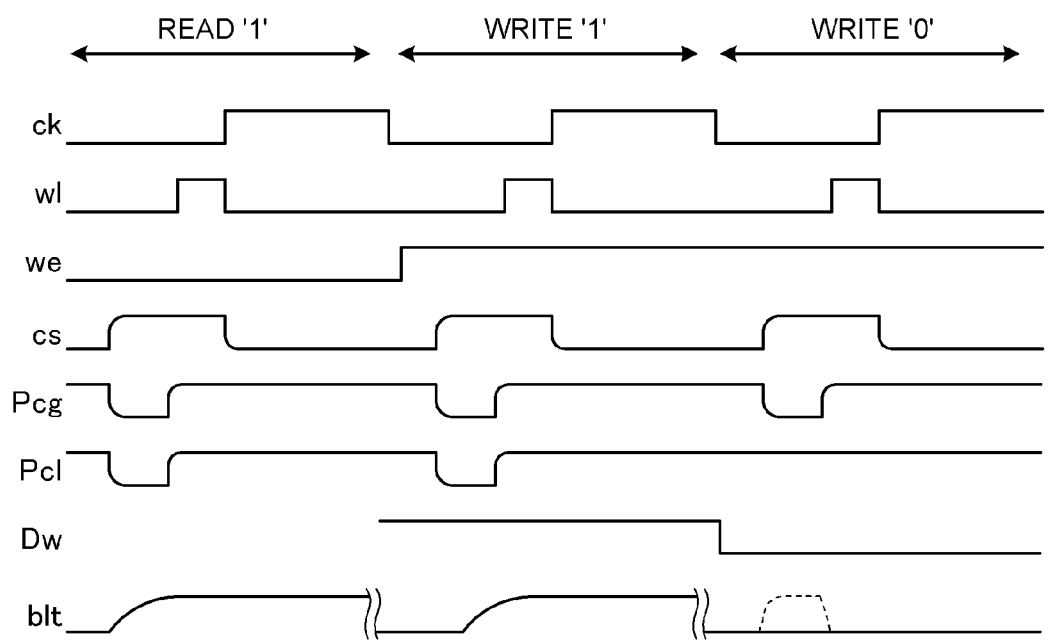
FIG. 6 is a timing chart illustrating a waveform of each unit at the time of reading and writing of the semiconductor storage device in FIG. 1.

FIG. 6 is a timing chart illustrating a waveform of each unit at the time reading and writing of the semiconductor storage device in FIG. 1.

In FIG. 6, in the semiconductor storage device in FIG. 1, a read period and a write period are switched in synchronization with a clock ck. When the read operation or the write operation is not performed, the bit lines blt and blc are maintained in a floating state. The potential difference between the bit lines blt and blc and the storage nodes nt and nc can be made small by maintaining the bit lines blt and blc in the floating state, so that leakage current between the bit lines blt and blc and the memory cell MC can be reduced, enabling to reduce power consumption.

Then, for example, when data '1' is read out from the memory cell MC, the write enable signal we is set to a low level. At this time, the storage node nt is maintained in a high level and the storage node nc is maintained in a low level. Then, when the global precharge signal Pcg falls, the local precharge signal Pcl falls. Therefore, the precharge transistors PT1 and PT2 are turned on and precharge of the bit lines blt and blc is performed. Then, when the potential of the word line wl rises, the N-channel field-effect transistors MN3 and MN4 in FIG. 2 are turned on.

At this time, because the storage node nt is maintained in a high level, the potential of the bit line blt maintains a high level. On the other hand, because the storage node nc is maintained in a low level, the potential of the bit line blc changes from a high level to a low level. Then, the potentials of the bit lines blt and blc are detected by the sense amplifier 6, so that the data '1' is read out from the memory cell MC.

Next, when the data '1' is written in the memory cell MC, the write enable signal we is set to a high level.

Therefore, the output of the NOR circuit N1 becomes a low level and thus the write transistor WT1 is turned off, and the output of the NOR circuit N2 becomes a high level and thus the write transistor WT2 is turned on.

Then, when the column select signal cs rises and the global precharge signal Pcg falls, if the potential of the bit line blt is a low level, the local precharge signal Pcl is caused to fall in the precharge control circuit 7. Therefore, the precharge transistors PT1 and PT2 are turned on and precharge of the bit lines blt and blc is performed. Then, when the global precharge signal Pcg rises, the local precharge signal Pcl rises. Therefore, the precharge transistors PT1 and PT2 are turned off, so that precharge of the bit lines blt and blc is not performed. At this time, because the write transistor WT1 is off and the write transistor WT2 is on, the bit line blt maintains a high level and the bit line blc changes to a low level.

Then, when the potential of the word line wl rises, the N-channel field-effect transistors MN3 and MN4 in FIG. 2 are turned on. Then, the potentials of the storage nodes nt and nc are set according to the potentials of the bit lines blt and blc, so that the data '1' is written in the memory cell MC.

Next, when data '0' is written in the memory cell MC, the write enable signal we is set to a high level. Therefore, the output of the NOR circuit N1 becomes a high level and thus the write transistor WT1 is turned on, and the output of the NOR circuit N2 becomes a low level and thus the write transistor WT2 is turned off.

Then, when the column select signal cs rises and the global precharge signal Pcg falls, if the potential of the bit line blt is a low level, the local precharge signal Pcl is maintained in a high level in the precharge control circuit 7. Therefore, the precharge transistors PT1 and PT2 are turned off and precharge of the bit lines blt and blc is not performed. At this time, because the write transistor WT1 is on and the write transistor WT2 is off, the bit line blt maintains a low level (a dotted-line waveform is a waveform when precharge of the bit line blt is performed) and the bit line blc maintains a high level.

Then, when the potential of the word line wl rises, the N-channel field-effect transistors MN3 and MN4 in FIG. 2 are turned on. Then, the potentials of the storage nodes nt and nc are set according to the potentials of the bit lines blt and blc, so that the data '0' is written in the memory cell MC.

Consequently, when the potential of the bit line blt according to the write data Dw is equal to the potential of the bit line blt before being precharged, precharge of the bit lines blt and blc can be prevented from being performed, so that excess amplitude generated in the potential of the bit line blt can be removed, enabling to reduce power consumption. At this time, probability that the potential of the bit line blt according to the write data Dw becomes equal to the potential of the bit line blt before being precharged is ½, so that power consumed at the time of writing when writing is performed on all columns can be approximately halved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a memory cell configured to store data;
   a bit line associated with a potential, wherein the potential changes based on write data to be written to the memory cell;
   a precharge circuit configured to precharge the bit line; and
   a precharge control circuit configured to control precharging of the bit line based on the potential of the bit line and the write data,
   wherein the precharge circuit comprises a precharge transistor, a source of the precharge transistor connected to a power supply potential and a drain of the precharge transistor connected to the bit line, and
   wherein the precharge control circuit is further configured to provide a local precharge signal to a gate of the precharge transistor.

2. A semiconductor storage device, comprising:
   a memory cell configured to store data;
   a bit line associated with a potential, wherein the potential changes based on write data to be written to the memory cell;
   a precharge circuit configured to precharge the bit line; and
   a precharge control circuit configured to control precharging of the bit line based on the potential of the bit line and the write data, wherein, when a potential of the bit line based on the write data is equal to a potential of the bit line before being precharged, the write data is written to the memory cell without precharging the bit line.

3. A semiconductor storage device, comprising:
   a memory cell configured to store data;
   a bit line associated with a potential, wherein the potential changes based on write data to be written to the memory cell;
   a precharge circuit configured to precharge the bit line; and
   a precharge control circuit configured to control precharging of the bit line based on the potential of the bit line and the write data; and
   a write amplifier configured to drive the bit line based on the write data at a time of writing.

4. The semiconductor storage device according to claim 3, further comprising a column selector configured to select memory cells for each column of a memory cell array.

5. The semiconductor storage device according to claim 4, wherein the column selector comprises a select transistor that is connected in series with the bit line and is configured to receive a column select signal at a gate of the select transistor.

6. The semiconductor storage device according to claim 3, wherein the write amplifier comprises a write transistor connected in series with the select transistor and a NOR circuit, the NOR circuit configured to drive a gate of the write transistor based on a logical NOR of the write data and a write enable signal.

7. The semiconductor storage device according to claim 5, wherein, when a potential of the bit line based on the write data is equal to a potential of the bit line before being precharged and a precharge signal is issued at a time of writing, the write data is written to the memory cell without precharging a bit line of a selected column.

8. The semiconductor storage device according to claim 1, wherein a plurality of memory cells are arranged in a matrix comprising a row direction and a column direction.

9. The semiconductor storage device according to claim 8, further comprising:
   a row decoder configured to perform row selection of the memory cell; and
   a word line configured to drive a memory cell in a row selected by the row decoder.

10. The semiconductor storage device according to claim 9, wherein the memory cell comprises an SRAM.

11. The semiconductor storage device according to claim 10, wherein the memory cell comprises:
    a first CMOS inverter comprising a first drive transistor and a first load transistor connected in series,
    a second CMOS inverter comprising a second drive transistor and a second load transistor connected in series,
    a first transfer transistor connected between a first storage node provided at a connection point of the first drive transistor and the first load transistor and a first bit line, and
    a second transfer transistor connected between a second storage node provided at a connection point of the second drive transistor and the second load transistor and a second bit line;

wherein an output and an input of the first CMOS inverter and the second CMOS inverter are cross-coupled with each other, and wherein a gate of the first transfer transistor and a gate of the second transfer transistor are connected to the word line.

12. The semiconductor storage device according to claim 1, further comprising a sense amplifier configured to detect data stored at the memory cell based on a signal read out from the memory cell on the bit line.

13. The semiconductor storage device according to claim 1, wherein when a read operation or a write operation is not performed, the bit line is maintained in a floating state.

14. A semiconductor storage device, comprising:
a memory cell configured to store data;
a bit line associated with a potential, wherein the potential changes based on write data to be written to the memory cell;
a precharge circuit configured to precharge the bit line; and
a precharge control circuit configured to control precharging of the bit line based on the potential of the bit line and the write data,
wherein the precharge control circuit comprises:
an EXOR circuit configured to receive a potential of the bit line and the write data,
a NAND circuit configured to receive an output of the EXOR circuit, a write enable signal, and a column select signal,
a NOR circuit configured to receive an output of the NAND circuit and a global precharge signal, and
an inverter configured to generate a local precharge signal by inverting an output of the NOR circuit and outputting the local precharge signal to the precharge circuit.

15. The semiconductor storage device according to claim 14, wherein, when a logical value of the global precharge signal is '1', a logical value of the local precharge signal is set to '1' and precharge of the bit line is not performed.

16. The semiconductor storage device according to claim 14, wherein, when logical values of the global precharge signal and the write enable signal are '0', a logical value of the local precharge signal is set to '0' and precharge of the bit line is performed.

17. The semiconductor storage device according to claim 14, wherein, when logical values of the global precharge signal and the column select signal are '0' and a logical value of the write enable signal is '1', a logical value of the local precharge signal is set to '0' and precharge of the bit line is performed.

18. The semiconductor storage device according to claim 14, wherein, when a logical value of the global precharge signal is '0' and logical values of the write enable signal and the column select signal are '1', if a potential of the bit line is equal to the write data, a logical value of the local precharge signal is set to '1' and precharge of the bit line is not performed.

19. The semiconductor storage device according to claim 14, wherein, when a logical value of the global precharge signal '0' and logical values of the write enable signal and the column select signal are '1', if a potential of the bit line is different from the write data, a logical value of the local precharge signal is set to '0' and precharge of the bit line is performed.

* * * * *